(12) United States Patent
Kiefer et al.

(10) Patent No.: US 9,933,492 B2
(45) Date of Patent: Apr. 3, 2018

(54) METHOD FOR SAFELY AND ECONOMICALLY OPERATING AN ELECTROLYSER

(75) Inventors: Randolf Kiefer, Marl (DE); Ulf-Steffen Baeumer, Unna (DE); Dietmar Wagner, Menden (DE); Michael Streitboerger, Dortmund (DE)

(73) Assignee: THYSSENKRUPP ELECTROLYSIS GmbH, Dortmund (DE)

( * ) Notice: Subject to any disclaimer, the term of this patent is extended or adjusted under 35 U.S.C. 154(b) by 882 days.

(21) Appl. No.: 14/233,838

(22) PCT Filed: Jul. 3, 2012

(86) PCT No.: PCT/EP2012/002786
§ 371 (c)(1),
(2), (4) Date: Apr. 18, 2014

(87) PCT Pub. No.: WO2013/010630
PCT Pub. Date: Jan. 24, 2013

(65) Prior Publication Data
US 2015/0127279 A1    May 7, 2015

(30) Foreign Application Priority Data
Jul. 19, 2011 (DE) .......... 10 2011 107 935

(51) Int. Cl.
*G01R 31/36* (2006.01)
*C25B 15/02* (2006.01)

(52) U.S. Cl.
CPC .......... *G01R 31/3648* (2013.01); *C25B 15/02* (2013.01); *G01R 31/361* (2013.01); *G01R 31/3665* (2013.01)

(58) Field of Classification Search
None
See application file for complete search history.

(56) References Cited

U.S. PATENT DOCUMENTS 3,855,104 A * 12/1974 Messner ............... C25B 1/26
204/256
4,952,298 A * 8/1990 Bouche-Pillon ...... C25B 15/02
204/228.3

(Continued)

FOREIGN PATENT DOCUMENTS

DE    68907094 T2    1/1994
EP        226411    *  6/2010 ............ C25B 15/02

(Continued)

OTHER PUBLICATIONS

International Search Report for PCT/EP2012/002786, English Translation attached to original, Both completed by the European Patent Office on Sep. 17, 2012, All together 7 Pages.

(Continued)

*Primary Examiner* — Alexander Satanovsky
*Assistant Examiner* — Brent A Fairbanks
(74) *Attorney, Agent, or Firm* — Brooks Kushman, P.C.

(57) ABSTRACT

A method for determining a safe and economic voltage operating range dependent on current density and/or a specific energy consumption operating range of a cell element of an electrolyser. A method for improving voltage results and/or specific energy consumption results, in which the voltage operating range and/or specific energy consumption operating range is determined depending on an operating parameter associated with the cell element.

7 Claims, 4 Drawing Sheets

(56) References Cited

U.S. PATENT DOCUMENTS

Figure 2:
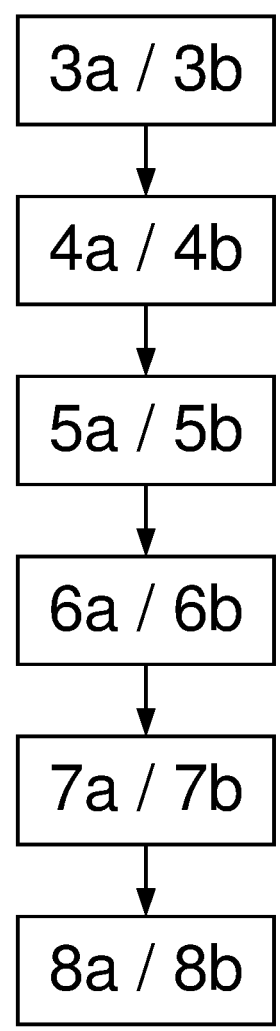

| | | | |
|---|---|---|---|
| 6,402,929 | B1 | 6/2002 | Sakata et al. |
| 7,122,109 | B2 | 10/2006 | Rantala et al. |
| 7,797,137 | B2 | 9/2010 | Veillette et al. |
| 2001/0039481 | A1* | 11/2001 | Tremblay ............... C25B 15/02 702/35 |
| 2006/0289312 | A1 | 12/2006 | Tremblay et al. |
| 2009/0321272 | A1* | 12/2009 | Kato ....................... C25B 1/285 205/351 |
| 2012/0138483 | A1 | 6/2012 | Tremblay et al. |

FOREIGN PATENT DOCUMENTS

| | | | |
|---|---|---|---|
| EP | 2226411 | | 9/2010 |
| EP | 2226411 A1 * | 9/2010 | ........ H01M 8/04955 |
| WO | 01/78164 A2 | | 10/2001 |
| WO | 2007087728 | | 8/2007 |
| WO | 2010118533 | | 10/2010 |

OTHER PUBLICATIONS

DePont Technical Information Bulletin No. 91-07, 1991, 4 Pages, "Nafion perfluorinated membrances, Brine Acidification."

Beckmann et al. Modern Chlor-Alkali Technology 2000, vol. 8, Chapter 16, pp. 196-212, "Know-how and Technology—Improving the Return on Investment for Conversions, Expansions and New Chlorine Plants."

Shiroki et al. Modern Chlor-Alkali Technology 1992, vol. 5, pp. 117-129, "Recent Development and Operation Dynamics of New Ion Exchange Membrane Series Aciplex-F From Asahi Chemical."

Cowell et al. Modern Chlor-Alkali Technology 1992, vol. 5, p. 143-158, "A New Improved for the Determination of Sodium Hydroxide Current Efficiency in Membrane Cells."

Bergner., Chem.-Ing.-Tech. 1994, vol. 66, No. 8, p. 1026-1033, English translation attached to original article, All together 14 Pages, "State of Development of alkali chloride electrolysis Part 2: Electrochemical Quantities, Economics."

* cited by examiner

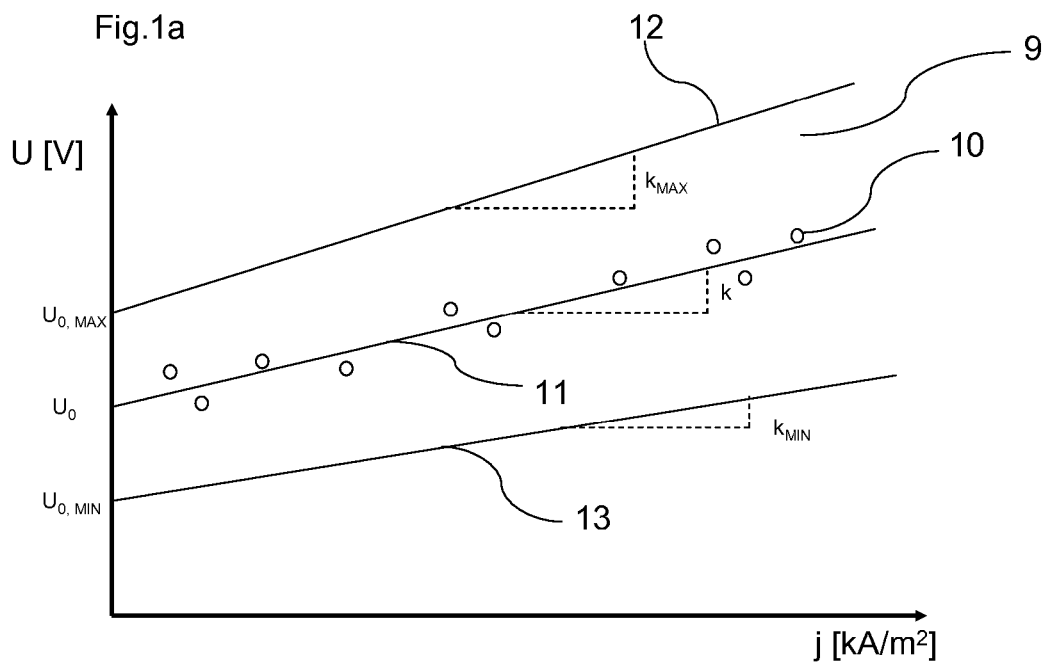
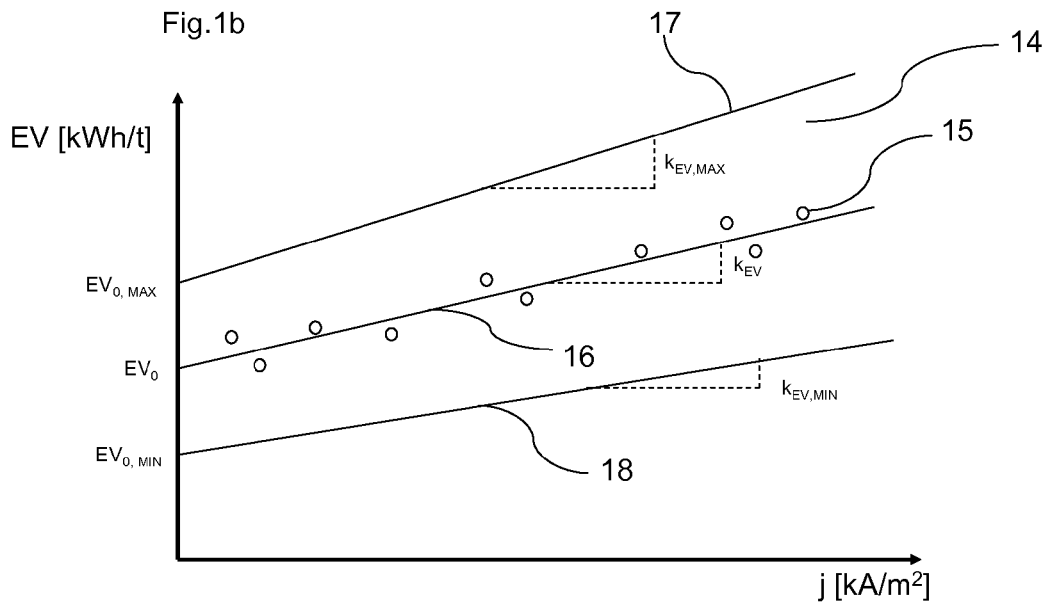

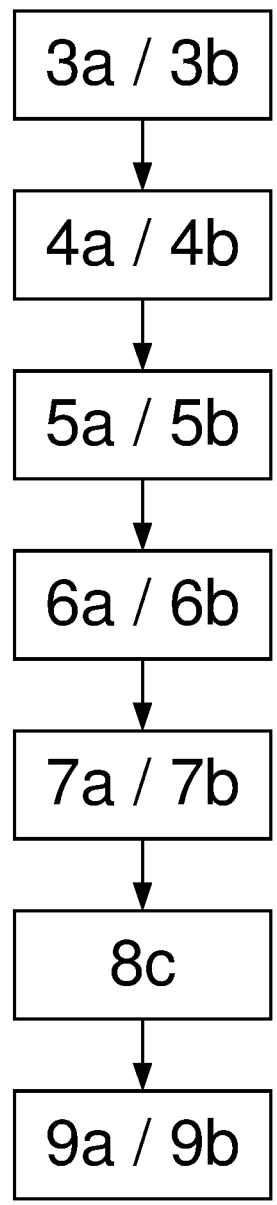

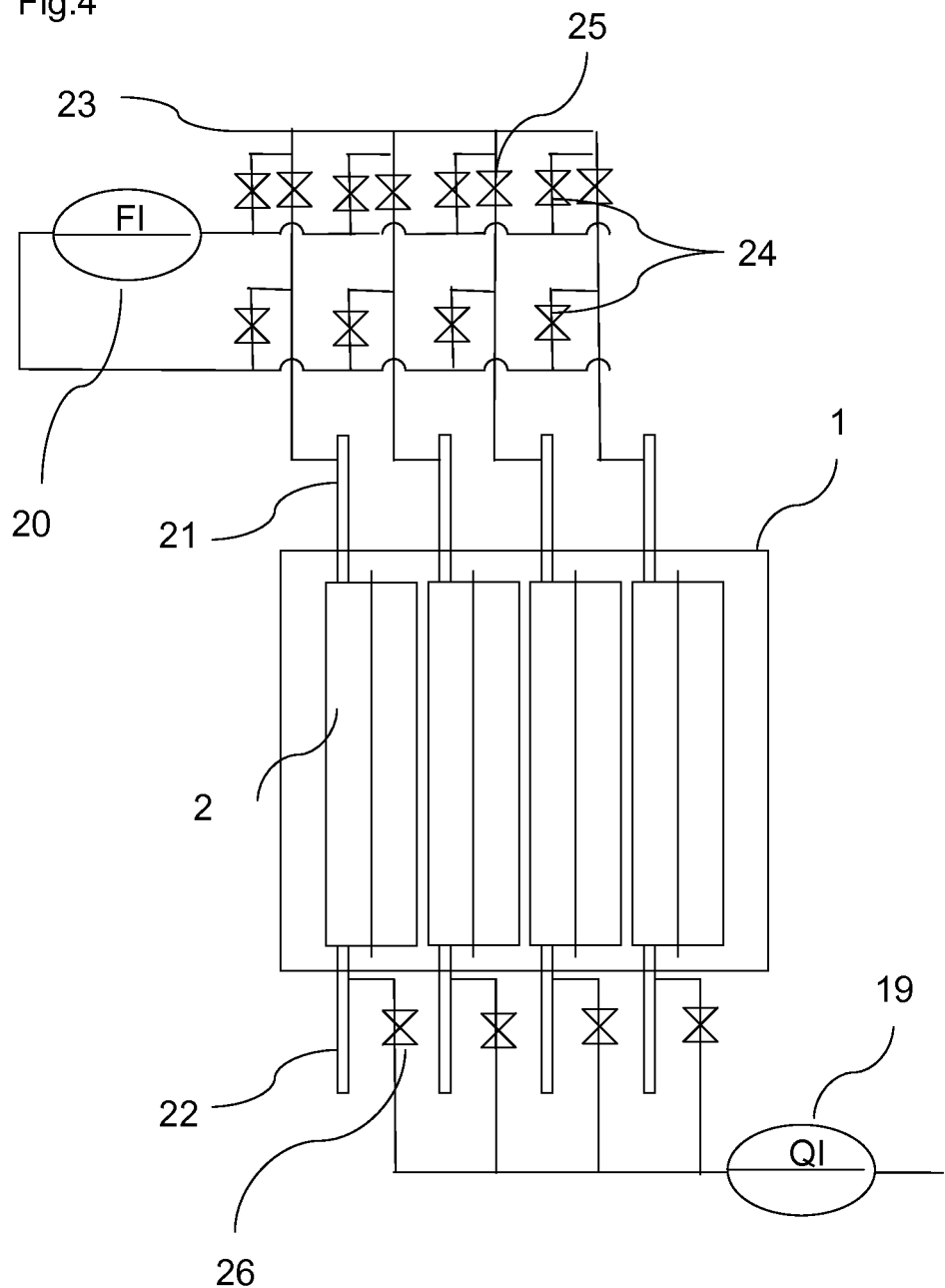

METHOD FOR SAFELY AND ECONOMICALLY OPERATING AN ELECTROLYSER

CROSS-REFERENCE TO RELATED APPLICATION

This application is the U.S. national phase of PCT Application No. PCT/EP2012/002786 filed on Jul. 3, 2012, which claims priority to German Patent Application No. 10 2011 107 935.5 filed on Jul. 19, 2011, the disclosures of which are incorporated in their entirety by reference herein.

The invention relates to a method for the operation of an electrolyser. A method is applied to determine a safe and economical current density-dependent voltage and/or specific energy consumption operating range of at least one cell element of an electrolyser.

The invention also relates to an electrolyser comprising at least one cell element.

The voltage U of a cellular element of an electrolyser and the applied current load, characterized as the electrolysis current of current intensity I, are important quantities in the context of electrolysis technology, since the current or energy consumption EV of the electrolyser depends on these physical quantities.

For reasons of practical assessment, the energy consumption of an electrolyser is normally referred to the product mass and thereby expressed specifically. According to Bergner's 'Entwicklungsstand der Alkalichlorid-Elektrolyse, Teil 2', ('State of the art in alkali chloride electrolysis', Part 2), Chemie-lngenieur-Technik 66 (1994) No. 8, the directly proportional relation between specific energy consumption and voltage in the classical chlor-alkali electrolysis can be calculated as follows:

$$EV = U/(F \times S) \, [kWh/t] \quad (1)$$

F herein represents a product-specific Faraday constant with the unit [t/kAh], which is formed by the quotient of molar Faraday constant and molar mass of the product, as the electrochemical formation of the product directly depends on the current intensity and hence on the charges employed.

The second significant proportionality factor is the current efficiency S, which gives the percentage ratio of practically formed product quantity $M_P$ and theoretically possible product quantity $M_T$ on the basis of the charges used:

$$S = 10033 \, M_P/M_T \, [\%] \quad (2)$$

Owing to charge leakages by stray currents, thermodynamic side reactions or even membrane damage resulting in loss of product, the current efficiency is always below 100%.

As the energy consumption of an electrolyser is the decisive criterion for the economical operation of an industrial electrolysis plant, the relation of current intensity and cell or electrolyser voltage is sufficient for assessing an economical operation on the assumption that the current efficiency of all single cell elements is constant. However, should the current efficiency S not be constant, maximally precise assessment of an economical operation of a cell element can only be done by determining and monitoring the specific energy consumption EV.

Other than in the case of voltage U, it is not possible to measure current efficiency S of each single cell element directly. Instead, the actual product quantity of each cell element is to be determined from practical analyses in order to obtain usable results for adequate determination of the energy consumption. Cowell, Martin and Revill have given a detailed description of the known empirical methods based on cathode-side or anode-side product balances in 'A new improved method for the determination of sodium hydroxide current efficiency in membrane cells', Modern Chlor-Alkali Technology Vol. 5, SCI London (1992).

There are also different approaches for replacing the indirect methods of analysis for determining the current efficiency by direct ones—so-called on-line measurement procedures, such as voltage measurement. In U.S. Pat. No. 7,122,109 Rantala and Virtanen described a voltage-based method of how current efficiency can be determined approximately by means of a differential analysis of measured and theoretically expected voltage through a proportionality factor. In WO 2010/118533 A1, Tremblay et al. describe a further possible method, wherein the current efficiency is calculated in low electrolysis currents from the time-dependent voltage curve over a non-linear regression with the aid of empirically determined cell parameters, which have been determined in advance using an appropriate model.

The plausibility and/or verification of the accuracy of such on-line models is difficult, since even analytical determinations of current efficiency have so far always illustrated the difficulty that the percentage of accuracy, such as in the case of cell voltage measurement, cannot be achieved based on error propagation and error addition through instruments and analytical results. Approaches to current efficiency measurement via cell voltage measurements and modelling are also disadvantageous, since these can only record the parameters determined from the history and from empirical observations of specific cell designs and process conditions and therefore become inaccurate as a result of minor changes and aging effects of components, or even fail completely.

An empirical determination of the current efficiency from quantity measurements and analyses, as illustrated by Cowell, Martin and Revill, for example, therefore delivers the most accurate results, which are required for the adequate determination of the specific energy consumption using known methods from prior art.

In order to identify a method in which the reliable and economical operation of a cell element depending on the electrolysis current can be ensured, the voltage is critical as the command variable.

The relationship between the voltage U of the cell element and the electrolysis current I is generally given by the current-voltage characteristic between 1.5 kA/m² and 7 kA/m² for the technically significant range:

$$U = C + k \times j \, (C, k = \text{constants}) \quad (3)$$

In place of the current intensity I, the current density j based on the active electrolysis area can be used, and is therefore given in kA/m².

According to Bergner 'Entwicklungsstand der Alkalichlorid-Elektrolyse, Teil 2', ('State of the art in alkali chloride electrolysis', Part 2), Chemie-lngenieur-Technik 66 (1994) No. 8, the cell voltage of an electrolytic cell of the chlor-alkali electrolysis is influenced by the structure and composition of the membrane, structure and properties of the active coating of the anode and cathode, and by structural components such as the ohmic resistance of the metallic anodic and cathodic compartments. Furthermore, the physical operating conditions under which the electrolyser is operated, such as catholyte and anolyte temperature, as well as pressure and electrolyte concentrations, are of particular importance.

Bergner, Hartmann and Kirsch investigated the physical significance of the k and c constants of the current/voltage characteristic to a sufficient degree. The results, published in "Voltage Current Curves: Application to Membrane Cells", Modern Chlor-Alkali Technology Vol. 4, SCI London (1990), clearly show that the constant C, in addition to the electrolytic decomposition voltage, also record the overvoltage of the anode and cathode, and consequently the properties of the active electrode coating. The ohmic resistances of the cell, which are determined by the membrane, the electrolyte and the structural losses of the compartments, including the metallic components within the cells, are represented by the k factor, which gives the gradient of the current/voltage characteristic.

According to Bergner, knowledge of the C and k constants is therefore crucial for clearly separating influences on the cell voltage, which are created by the membrane and cell components on the one hand, or by the electrode coating on the other hand, from one another in long-term operation.

In practical electrolysis operation, it has also been shown that the voltage U of individual cell elements is not the same, despite having the same components in an electrolyser. This is attributable to various influences, such as the position of the membrane, electrolyte supply and distribution, production tolerances of all components, but also membrane damage. For example, cracks or holes in the membrane cause significant cell voltage deviations of a cell element from the voltage mean value of all the cell elements of an electrolyser.

In addition to purely physical aspects, however, the structural design and the condition of the cell components are also of decisive influence on cell voltage U. Cell designs with different internal arrangements of components, such as various types of electrodes, the chemical and physical structure and the age of the anodic and cathodic electrode coatings or the membrane type and condition are significant factors, the quantities of which substantially determine the cell voltage.

Monitoring the cell voltage U of a cell element and knowledge of the current/voltage characteristic are therefore crucial instruments for ensuring the safety of an electrolyser.

For example, for chlor-alkali electrolysis, in the technically significant range of 1.5 to 7 kA/m², the current density-dependent voltage operating ranges of a cell element are defined using the straight line equations that are dependent on time t $$U_{min}=U_{0,min}+k_{min}\times j(t) \text{ and} \quad (4)$$

$$U_{max}=U_{0,max}+k_{max}\times j(t), \quad (5)$$

which, based on empirically and theoretically found values, represent a safe electrolyser. Current density j is determined via the relationship between electrolysis current I and the electrolytically active cross-sectional area of the cell element.

Taking account of the individual current efficiency S of each cell element, an energy consumption range that is dependent on current density can also be defined, which is limited by the corresponding time-dependent linear equations $$EV_{min}=EV_{0,min}+k_{EV,min}\times j(t) \text{ and} \quad (6)$$

$EV_{min}$, $EV_{0,min}$, $EV_{max}$, $EV_{0,max}$ can be determined using current efficiency S and formula (1) from $U_{min}$, $U_{0,min}$, $U_{max}$ and $U_{0,max}$.

$$EV_{min}=U_{min}/(F\times S) \text{ [kWh/t]} \quad (8)$$

$$EV_{max}=U_{max}/(F\times S) \text{ [kWh/t]} \quad (9)$$

$$EV_{0,min}=U_{0,min}/(F\times S) \text{ [kWh/t]} \quad (10)$$

$$EV_{0,max}=U_{0,max}/(F\times S) \text{ [kWh/t]} \quad (11)$$

Similarly, $k_{EV,min}$, $k_{EV,max}$ result by entering $k_{min}$ and $k_{max}$ in formula (1):

$$k_{EV,min}=k_{min}/(F\times S) \text{ [(kWh/t)/(kA/m}^2\text{)]} \quad (12)$$

$$k_{EV,max}=k_{max}/(F\times S) \text{ [(kWh/t)/(kA/m}^2\text{)]} \quad (13)$$

Accordingly, voltages of cell elements within a range between $U_{min}$ and $U_{max}$ represent effective voltages, which guarantee the safety and conditionally the economic viability of an electrolyser. $EV_{min}$ and $EV_{max}$ however, represent effective specific energy consumption values, which also ensure sufficiently the economic viability of an electrolyser.

The constants $U_{0,min}$ and $U_{0,max}$ or $EV_{0,min}$ and $EV_{0,max}$ accordingly limit a range in which the anode and cathode electrodes coatings have economically acceptable overvoltages or potentials, while $k_{min}$ and $k_{max}$ or $k_{EV,min}$ and $k_{EV,max}$ define an area in which the condition of membrane and cell structure guarantees reasonable operation from the economy and safety point of view.

To compare non-standardised measured voltages and/or measured voltage changes with $U_{min\ and}\ U_{max}$ is known from prior art, but this nevertheless gives inaccurate or even misleading voltage measurement results. Not one single established procedure using the comparison of measured specific energy consumption and/or energy consumption changes is known, since the necessary individual current efficiency per cell element is considered to be inaccessible via direct measurements.

The purpose of the invention is therefore to provide a method of the type mentioned at the beginning, which in terms of safety and also—to a limited extent—from economic viability points of view, leads to better voltage measurement results and/or the precise determining of the specific energy consumption per cell element and thus describes the limitation of a sufficiently economical energy consumption operating range that is dependent on current density.

This purpose is achieved by the features of claim 1. Advantageous embodiments of the invention emerge from the subordinate claims.

The invention provides a method for operating an electrolyser, the method comprising the following steps a) determination of a safe and economical current density-dependent voltage operating range and/or a specific energy consumption operating range, wherein a voltage change and/or a specific energy consumption change occurs in dependence of an operating parameter assigned to the cell element (2), in particular in dependence of a temperature and/or an anodic electrolyte concentration and/or a cathodic electrolyte concentration and in dependence of a time-independent current change;

b) measurement of the voltages of the cell element (2) over time and/or determination of the current efficiency of the cell element (2) over time and calculation of the specific energy consumption with the measured voltage over time;

c) normalisation of the voltages measured in step b) on the operating parameters assigned to the cell element (2) and/or normalisation of the specific energy consumptions determined in step b) on the operating parameters assigned to cell element (2);

d) determination of the voltage changes between the voltages normalised in step c) and/or determination of the specific energy consumption changes between the specific energy consumption normalised in step c);

e) comparison of the voltages in step c) and/or the voltage changes in step d) with the voltages and voltage changes in step a)

and/or comparison of the determined specific energy consumptions in step c) and/or the specific energy consumption changes in step d) with the specific energy consumptions and specific energy consumption changes in step a).

In this case, the determination of the voltage operating range ($U_{min}$ to $U_{max}$) and/or the energy consumption operating range ($EV_{min}$ to $EV_{max}$) takes place in dependence on at least one of the physical operating parameters assigned to the cell element. The energy consumption is thus advantageously determined using formula (1), taking account of the current efficiency according to formula (2) or according to the formula (14), and the voltage operating range is determined using formula (3).

The core idea of the invention is to compare measured voltages or measured voltage differences with limit voltages $U_{min}$ and $U_{max}$ and/or specific energy consumptions or specific energy consumption differences determined from the measured voltages and calculated current efficiencies with specific limit energy consumptions $EV_{min}$ and $EV_{max}$, taking account of the operating conditions.

Studies have shown that the comparison of measured voltages and/or measured voltage differences with $U_{min}$ and/or $U_{max}$ according to the prior art, as explained in EP 2226411 A1, for example, i.e. for example without taking account of the operating temperature, lead to misleading results, since the operating temperature has a considerable influence on the measured voltage and/or the resulting calculated specific energy consumption of the cell element and/or the resulting change in voltage and/or specific energy consumption.

If, for the purpose of determining a safe and economical operating voltage range to determine the constant k in a cell element, for example, a voltage of 2.90 V at 10 kA and 83° C. as well as a voltage of 2.95 V at 15 kA and 90° C. are measured, the resulting constant k is lower than the specified constant $k_{min}$, which is nevertheless attributable to a lower internal resistance of the cell element based on the higher operating temperature and not to an unsafe operating condition of the cell element. The same applies accordingly to the specific energy consumption, since the quantities $k_{EV}$ and $K_{EV,min}$ depend linearly on k and $k_{min}$ by the current efficiency.

For this reason, the voltage operating range and/or specific energy consumption operating range is determined in dependence of at least one of the temperatures assigned to the cell element (2) and/or an anodic and/or cathodic electrolyte concentration assigned to the cell element (2).

It has been found that the electrolyte concentration in the anodic and/or cathodic compartment exerts influence on the internal resistance of a cell element and consequently on the measured voltage and/or voltage change and/or the specific energy consumption or energy consumption change. For this reason, the invention in step a) provides that the determination of the voltage operating range and/or the specific energy consumption operating range takes place in dependence of the anodic and/or cathodic electrolyte concentration assigned to the cell element.

Preferably, the voltage change of the cell element occurs in dependence of a time-independent current density change $\Delta j$. Contrary to the prior art, as described in EP 2 226 411 A1, this therefore means that the velocity of the current density change, i.e. dj/dt, is not used as a basis, since the velocity of the current density change makes only a very limited and inaccurate statement about the condition of the cell element. For example, if the membrane or the electrode has holes or a blocking film, the voltage change characteristic of the membrane or electrode state proves not to be dependent on a temporal dependence of the current density. Studies have shown that the voltage change, which is set solely based on different velocities when the applied current is changed, gives hardly any information about the condition of the cell element.

It is established that the specific energy consumption change of the cell element also occurs in this respect in dependence of a time-independent current density change $\Delta j$, since the specific energy consumption of a cell element according to formula (1) is directly proportional to the cell voltage. The current efficiency is also slightly dependent on the current density (see, for example, Shiroki, Hiyoshi, Ohta in 'Recent developments and operation dynamics of new ion exchange membrane series Aciplex-F', Modern-Chlor-Alkali Technology Vol. 5, SCI London (1992) or Cowell, Martin and Revill in 'A new improved method for the determination of sodium hydroxide current efficiency in membrane cells", Modern-Chlor-Alkali Technology Vol. 5, SCI London (1992), but for these considerations it can be assumed to be constant or directly determined via time and current density-dependent measurements according to formula (2) or formula (14).

In step a) the specific energy consumption in kWh/t product is advantageously calculated from voltage U using the relationship $$EV=U/(F\times S), \quad (1)$$

wherein F denotes a product-specific Faraday constant with the unit [t/kAh], which is formed by the quotient from molar Faraday constant and molar mass of the product, and S denotes the current efficiency of the membrane used, which gives the ratio of practically formed product quantity and theoretically possible product quantity based on the charges used with the unit [kg/kg] or [%].

In another preferred embodiment of the invention the specific energy consumption is calculated in step a) using a percentage current efficiency S, which is described via the relationship $$S=P1-(P2/I)\times(Q_A\times d_A\times c_A)/N+(0.5-y_{O2})\times P3, \quad (14)$$

wherein I is the electrolysis current in [kA], N the number of analysed cell elements, $Q_A$ the acid flow stream fed to the electrolyser or the single cell element in [L/h], $d_A$ the density of the acid in [kg/L], $c_A$ the mass concentration of the acid used in [kg/kg], $Y_{O2}$ the oxygen content in the anodic product gas in [kg/kg], P1 an empirically determined parameter that is preferably between 98.5% and 99.5%, and most preferably between 98.9% and 99.1%, P2 is an empirically determined parameter that is preferably between 50 and 100% kg/kAh and most preferably between 70 and 90% kg/kAh and P3 is an empirically determined parameter that is preferably between 2.0% and 3.0% and most preferably between 2.4% and 2.6%

The application of this formula according to the invention has the advantage that online methods can be used to generate models to determine current efficiency from online-measured analysis results. In the case of chlor-alkali electrolysis, the necessary quantity measurement is possible by balancing the anodically formed species in the electrolyte and in the gas phase in comparison to the chloride quantity in the feed brine.

In addition to chlorine and oxygen in the gas phase, these anodically formed species are sodium hypochlorite, sodium chlorate, sodium carbonate, hydrochloric acid and sodium hydroxide in the liquid phase, which are used for the balancing for the analytical determination of the current efficiency.

Consideration of the respective content of the various anodically formed species results in the practical relationship that essentially the anodically formed oxygen in the chlorine, which is formed based on the cathodic "lye loss" through water electrolysis of the brine, almost exclusively defines the current efficiency, while the proportion of other species is low or even negligible. The only exception is the hydrochloric acid, since the water electrolysis and consequently the formation of oxygen may significantly be influenced by acidification of the anolyte (e.g. Shiroki, Hiyoshi, Ohta in 'Recent developments and operation dynamics of new ion exchange membrane series Aciplex-F', Modern-Chlor-Alkali Technology Vol. 5, SCI London (1992) or 'Nafion fluorinated Membranes—Brine acidification'. DuPont Technical Information Bulletin 91-07 (1991)).

A major advantage of this formula-correlation is above all the independence of design details such as cell design and the condition of the cell components, as well as aging effects of the cell and its components, since only the pure chemical context is considered here. The disadvantage of the on-line voltage measurement method for determining current efficiency according to U.S. Pat. No. 7,122,109 or WO 2010/118533 A1, which are plant and design-specific, is no longer given.

The specific energy consumption can thus be determined relatively easily by measuring the current, voltage, oxygen content of the anodic product gas and the acid feed stream if this is done by the user. The core issue is the acid stream command variable, which must be added in such quantities that a specific oxygen content is reached, as explained in detail by Beckmann and Lüke in "Know-how and Technology—Improving the Return on Investment for Conversions, Expansions and new Chlorine Plants", Modern Chlor-Alkali Technology Vol. 8, SCI London (2000), pp. 202ff.

Based on the results from the acid stream and the oxygen content obtained, parameters P1, P2 and P3 can be adapted to this formula. The following table lists appropriate examples that demonstrate the choice of parameters. S(1) refers to the prior experimentally determined current efficiency, S(2) the value calculated from the formula according to the invention:

TABLE 1

Comparison of measured current efficiency S(1) with the calculated current efficiency S(2), which was calculated using the empirical parameters P1, P2, P3 via the formula relationship according to the invention:

| P1 | 98.9 | 99.0 | 99.0 |
| P2 | 70 | 75 | 94 |
| P3 | 2.4 | 2.5 | 2.5 |
| N | 172 | 165 | 168 |
| I | 12.9 | 13.6 | 13.9 |
| YO2 | 1.5 | 1.3 | 1.3 |
| QA | 168 | 204 | 677 |
| dA | 1.05 | 1.05 | 1.05 |
| cA | 0.15 | 0.15 | 0.15 |
| S(1) | 95.76 | 95.93 | 92.71 |
| S(2) | 95.80 | 96.00 | 92.70 |

For electrolysers consisting of cell elements arranged in stacks the equipment expenditure for the measurements is low, however, it is higher for single cell elements, since the oxygen concentration and acid feed must be measured for each cell element. This can be achieved by using a pipe routing, wherein the anodic discharge of the products is equipped with an appropriate product gas sampling point for each cell element, which, by means of valves appropriately timed by a measurement logic, permits the measurement of the oxygen $y_{O2}$ in the product gas via analysis devices such as a gas chromatograph, in which the oxygen content of each cell element is measured through the timed successive opening and closing of the valves. The appropriate amount of acid quantity $Q_A$ that may be fed to the anodic reactant stream must be defined in the same way for each cell element and is fed in a decentralised way to the anodic reactant feed for each cell element. The measurement is performed such that, using a measuring logic with appropriately timed valves, the feed quantity of the acid $Q_A$ is not fed directly, but is routed via a measuring instrument arranged in parallel for flow-rate measurement, and is then fed to the cell. This process is performed sequentially for each cell element so that cell-specific results are obtained for the set oxygen content in the product gas $y_{O2}$ and the fed acid quantity $Q_A$, which allow the current efficiency to be determined according to formula (14).

In the detailed design of the invention, the measurement method (as in FIG. 4) therefore runs so that a) a measurement of the oxygen $y_{O2}$ in the product gas is carried out by means of the timed successive opening of the valve (26) in a gas sampling line for each cell element, one measurement of the oxygen in the product gas being done after the gas has been fed to the measuring apparatus with the valve (26) closing after the end of the measurement, and b) a measurement of the acid stream $Q_A$ to the single cell element is performed by means of the timed successive opening of two valves (24) arranged around a flow meter for each cell element and the simultaneous closing of the parallel bypass valve (25), one measurement of the acid stream $Q_A$ for each cell element being done after the acid has been fed to the flow meter, with the valves (24) closing and the bypass valve (25) opening after the end of the measurement.

In step c) of the method according to the invention, the measured voltage and/or the determined specific energy consumption is normalised on the operating parameter that is assigned to the cell element (2), in particular the temperature of the cell element and/or the anodic electrolyte concentration and/or cathodic electrolyte concentration.

For the determination of the "temperature" operating parameter, for example, under the method according to the invention, the following sequence can be used as a basis for each cell element:

1. Measuring the mean temperature of the cathodic compartments of all cell elements of an electrolyser using a conventional measuring device, particularly using a probe that is routinely installed in the shared catholyte outlet of all cell elements, 2. Measuring the mean temperature of the anodic compartments of all cell elements of an electrolyser using a conventional measuring device, particularly using a probe that is routinely installed in the shared anolyte outlet of all cell elements, 3. Forming the mean value from the anodic and cathodic mean temperature for determining the mean electrolyser temperature T, 4. Measuring all individual cell voltages $U_i$ and forming the mean value $U_M$ of the cell element voltages of the respective electrolyser, 5. Determining the deviation of the cell voltage of each cell element from the mean value determined in step 4 using $$\Delta U_i = U_i - U_M \text{ and} \quad (15)$$

6. Based on the voltage deviation from the voltage mean value of each cell element calculated in step 5 and the mean electrolyser temperature determined in steps 1 to 3, determining the single cell element temperature $T_i$ over a factor K, which is preferably within the 10 to 30 Kelvin/V range:

$$T_i = T + (K \times U_i) \quad (16)$$

Furthermore, the invention provides that the electrolyser (1) be switched off and/or an alarm is given as soon as the normalised voltages and/or specific energy consumptions in step c) and/or the voltage changes and/or specific energy consumption changes in step d) are outside the voltage operating range and/or specific energy consumption operating range defined in step a). The steps mentioned refer to the method described in the preceding section.

In a preferred embodiment a reference is determined additionally. This is done advantageously by the single cell element itself being selected as a reference for each single cell element, with the characteristics empirically determined from the operation history of each single cell element defining the reference properties. Alternatively, a theoretical cell element is selected as a reference, which features at least one, preferably several of the characteristics such as identical cell design, identical cell components, identical membrane, identical electrode coatings, identical process conditions and/or identical operating time of the cell element to be compared.

In another embodiment the voltages measured and/or specific energy consumptions calculated in step b) of the method described in claim 10 and the resulting voltage changes and/or specific energy consumption changes are compared with the reference.

Further, the invention provides for an electrolyser (1) with at least one cell element (2) for the operation of a method according to claim 1, comprising the following elements:
a) means for the determination of a current density-dependent voltage operating range and/or a specific energy consumption operating range, wherein at least one measuring probe being either a temperature measuring device and/or a concentration measuring device is assigned to the at least one cell element (2),
b) means for the measurement of voltages of the cell element (2) over time and/or means for the determination of the current efficiency of the cell element (2) over time and means for the calculation of the specific energy consumption with the measured voltage over time;
c) means for the normalisation of voltages measured in step b) on the operating parameters assigned to the cell element (2) and/or means for the normalisation of the specific energy consumptions determined in step b) on the operating parameters assigned to cell element (2),
d) means for the determination of voltage changes between the voltages normalised in step c) and/or means for the determination of the specific energy consumption changes between the specific energy consumptions normalised in step c),
e) means for comparing the voltages from c) and/or for comparing the voltage changes from d) with the voltages and voltage changes from a)

and/or
means for comparing the determined specific energy consumptions from c) and/or comparing the specific energy consumption changes from d) with the specific energy consumptions and specific energy consumption changes from a).

In a preferred embodiment, the electrolyser has at least one oxygen gas measuring device (19) and at least one acid flow measurement (20) for at least one cell element, and preferably has at least 4 valves 2× (24), (25) and (26) for each cell element, which are assigned to each cell element (2).

Finally, the invention provides for means by which the electrolyser (1) is switched off and/or means for signalling alarm as soon as the normalised voltages and/or specific energy consumption from step c) and/or the voltage changes and/or specific energy consumption changes from step d) are outside the voltage operating range and/or specific energy consumption operating range defined in step a).

A further embodiment of the electrolyser provides for means for the determination of a reference, in which either
    the single cell element itself serves as a reference for each single cell element, with the characteristics empirically determined from the operation history of each single cell element defining the reference properties, or
    a theoretical cell element serves as a reference, which features at least one, preferably several of the characteristics from the group comprising identical cell design, identical cell components, identical membrane, identical electrode coatings, identical process conditions and/or identical operating time of the cell element to be compared.

The electrolyser further comprises means for comparing the voltages measured and/or specific energy consumptions calculated from step b) and the resulting voltage changes and/or specific energy consumption changes with the reference.

The invention is described in more detail below with reference to the drawings. The following are shown schematically:

FIG. 1a Graphical representation of a safe voltage operating range of a cell element of an electrolyser, FIG. 1b Graphical representation of a safe and economical energy consumption operating range of a cell element of an electrolyser, FIG. 2 Flow diagram of the method according to the invention FIG. 3 Flow diagram of another embodiment of the method according to the invention FIG. 4 Diagram illustrating the basic measuring apparatus for determining the oxygen content in the product gas and the acid stream to the reactant stream of each cell element of an electrolyser.

In a graphical representation 9, FIG. 1a shows voltages 10 in dependence of the current density j (kA/m²), the voltages having been measured in a cell element of an electrolyser. The resulting voltage regression line has the reference number 11 and features the voltage value $U_0$ on the ordinate axis. Moreover, voltage regression line 11 has the gradient k. Voltage straight lines 12, 13 with gradients $k_{min}$ and $k_{max}$ and voltage values $U_{0,max}$, $U_{0,min}$ located on the ordinate axis emanate from graphical representation 9. Gradients k, $k_{max}$ and $k_{min}$ as well as voltage values $U_0$, $U_{0,max}$, $U_{0,min}$ represent properties of the cell element such as the coating of the electrodes or the ohmic resistances of membrane, electrolyte and metallic compartments.

Voltage straight lines 12, 13, which are based on empirical values, designate borderline cases for a safe voltage operating range, i.e. as long as voltage regression line 11 extends between voltage straight lines 12, 13, a safe voltage operating range of a cell element of an electrolyser can be assumed. If, however, the measurements of voltage values 10 produce a course of voltage regression line 11, which leads to shared intersections with voltage straight lines 12, 13, i.e. that voltage values 10 are above or below the voltage straight lines 12, 13, it must be assumed that the voltage operating range of the cell element of an electrolyser is unsafe. The voltage straight lines therefore represent a cell element condition in which safe operation is still given.

The mere contemplation of the voltage ratios is meaningful as regards safe operation, but for the assessment of economical operation it is merely a necessary but insufficient criterion, since the specific energy consumption is decisive for this. In a graphical representation 14, FIG. 1b shows specific energy consumptions 15 in dependence of the current density j ($kA/m^2$), which have been determined in a cell element of an electrolyser. The resulting specific energy consumption regression line has the reference number 16 and features the specific energy consumption value $EV_0$ on the ordinate axis. Moreover, specific energy consumption regression line 16 has the gradient $k_{EV}$. Specific energy consumption straight lines 17, 18 with gradients $k_{EV,min}$ and $k_{EV,max}$ and energy consumption values $EV_{0,max}$, $EV_{0,min}$ located on the ordinate axis emanate from graphical representation 14. Gradients $k_{EV}$, $k_{EV,max}$ and $k_{EV,min}$ as well as specific energy consumption values $EV_{0,EV0,max}$, $EV_{0,min}$ represent properties of the cell element such as the coating of the electrodes or the ohmic resistances of membrane, electrolyte and metallic compartments, as well as properties of the membrane by means of the current efficiency.

Specific energy consumption straight lines 17, 18, which are based on empirical values of the current density-dependent voltages and current efficiencies, designate borderline cases for an economical specific energy consumption operating range, i.e. as long as specific energy consumption regression line 16 deviates between specific energy consumption straight lines 17, 18, a sufficiently economical specific energy consumption operating range of a cell element of an electrolyser can be assumed. If, however, specific energy consumption values 15 determined from voltage and current efficiency measurements produce a course of specific energy consumption regression line 16, which leads to shared intersections with specific energy consumption straight lines 17, 18, i.e. that specific energy consumption values 15 are above or below specific energy consumption straight lines 17, 18, it must be assumed that the specific energy consumption operating range of the cell element of an electrolyser is uneconomical. The specific energy consumption regression lines thus represent a condition of the cell element in which indirectly a safe, but above all economical operation, is given.

In order to be able to obtain and specify the safe and economical voltage operating range with greater accuracy, the method according to the invention in a first step 3a initially provides for, as shown in FIG. 2, voltage straight lines 12, 13 that are visible in FIG. 1a to be determined in a cell element 2 of an electrolyser 1. $U_{0,min}$ can preferably be between 2.2 and 2.4 V and $U_{0,max}$ between 2.5 and 2.8 V. The values for $K_{min}$ are preferably between 0.05 and 0.08 V/kA/$m^2$ and the values for $k_{max}$ preferably between 0.15 and 0.25 V/kA/$m^2$. Voltage straight lines 12, 13 in step 3 are determined in dependence of the prevailing temperature T in cell element 2 of electrolyser 1 by means of temperature measuring device 2a. This temperature is preferably between 80 and 100° C., most preferably at approximately 90° C.

Voltage straight lines 12, 13 can also be determined in the context of the invention in dependence of the anodic and/or cathodic electrolyte concentration that is present in cell element 2. These concentrations can be determined using conventional analytical means.

In order to be able to obtain and specify not only the safe, but also the economical operating range with greater accuracy, the method according to the invention in a first step 3b initially provides for, as shown in FIG. 2, specific energy consumption straight lines 17, 18 that are visible in FIG. 1b to be determined in a cell element 2 of an electrolyser 1. $EV_{0,min}$ can preferably be between 1500 and 1650 KWh/t and $EV_{0,max}$ between 1750 and 1900 kWh/t. The values for $k_{EV,min}$ are preferably between 30 and 60 (kWh/t)/(kA/$m^2$) and the values for $k_{EV,max}$ preferably between 100 and 200 (kWh/t)/(kA/$m^2$).

In step 3b, specific energy consumption straight lines 17, 18 are also determined in dependence of mean temperature T prevailing in cell element 2 of electrolyser 1 by means of at least one temperature measuring device 2a. This at least one temperature is preferably between 80 and 100° C., most preferably at approximately 90° C. Voltage straight lines 12, 13 and/or—using them as a basis—specific energy consumption straight lines 17, 18 can also be determined in the context of the invention in dependence of the anodic and/or cathodic electrolyte concentration that is present in cell element 2. These concentrations can be determined using conventional analytical means.

Furthermore, in steps 3a and 3b the voltage change and/or the specific energy consumption change are determined in dependence of a time-independent current density change, i.e. the voltage change is given by $\Delta U = k \times \Delta j$ (see FIG. 1a) and the specific energy consumption change by $\Delta EV = k_{EV} \times \Delta j$ (see FIG. 1b).

In step 4a of the method according to the invention, the measurement of the voltages U, which are indicated in FIG. 1a by reference number 10, of the cell element 2 is initially carried out, and in step 5a the normalisation on the operating parameters such as mean temperature T and anodic and cathodic electrolyte concentration. After current efficiency S has been determined, specific energy consumption EV of cell element 2, which is indicated in FIG. 1b by reference number 15, is calculated in step 4b based on the voltage measured in step 4a and the normalization in step 5a. Voltage regression line 11 is used to determine the voltage changes between the voltages normalised in step 5a in a further step 6a. Optionally, in addition, the changes of the specific energy consumption between the specific energy consumptions determined in step 4b and normalised in step 5b are determined with the specific energy consumption regression line 16 in step 6b.

As part of a step 7a, voltage regression line 11 from FIG. 1a is compared with voltage straight lines 12, 13 from FIG. 1a is then carried out, i.e. the measured and normalised voltage changes and the resulting gradient k are compared with the voltage changes and gradients $k_{min}$ and $k_{max}$ reflected by voltage straight lines 12, 13 from FIG. 1a. In parallel, in step 7b, specific energy consumption regression line 16 from FIG. 1b can be compared with specific energy consumption straight lines 17, 18 from FIG. 1b, i.e. the measured and normalised specific energy consumption changes and the resulting gradient $k_{EV}$ are compared with the specific energy consumption changes and gradients $k_{EV,min}$ and $k_{EV,max}$ reflected by energy consumption straight lines 17, 18 from FIG. 1b.

Finally, in a conclusive step 8a, a shutdown of electrolyser 1 occurs or an alarm is given when at least part of the voltage regression line 11 is above voltage straight line 12 or below voltage straight lines 13, i.e. as soon as measured and normalised voltages and/or voltage changes are outside the voltage operating range. For the specific energy consumption, electrolyser 1 can be shut down or an alarm given in a step 8b if at least part of specific energy consumption regression line 16 is above specific energy consumption line 17 or below specific energy consumption line 18, i.e. as soon as the specific energy consumptions and/or specific energy consumption changes determined on the basis of measured and normalised voltages are outside the specific energy consumption operating range.

The method according to the invention may be extended, as shown in FIG. 3. In additional steps, which are indicated in FIG. 3 by reference numbers 8c, 9a, 9b, a reference can be defined in step 8c. The measured voltage and the resulting voltage changes and/or the determined specific energy consumption and the resulting specific energy consumption changes are then compared with the reference in a final step 9a and/or 9b.

Various aspects are relevant for determining the reference. According to prior art, as disclosed for example in publication WO 2007/087728 A1, a single reference element or a group of internal reference elements can be selected from the electrolyser to be used as a reference. However, an arbitrary choice is not sufficient, since the same physical and electrochemical properties the reference and the single element play a decisive role in making accurate statements. For example, if cell elements that use different technology, are of different ages or are operated with different cell components are operated in the same electrolyser, their current/voltage characteristic will be different to the extent that an arbitrary choice of a single reference element or a group of internal reference elements is not sufficient to arrive at an optimum result in respect of economical and safety aspects.

The comparison of each single element with itself in the form of its properties determined from the operating history will thus provide the most accurate result as a reference.

A theoretical cell element, which has at least one, preferably several of the features such as identical cell design, identical cell components, identical membrane, identical electrode coatings, identical process conditions and/or identical operating time of the cell element to be compared, can also be defined as a reference. Since the current/voltage characteristic and the time curve of the current efficiency of the reference defined in this manner are known from empirical data, a voltage comparison and/or specific energy consumption comparison can be performed easily.

This means that uneconomical and unsafe cell elements can be detected with high precision by means of steps 8a, 8b, since any deviation from individually known behaviour can be detected immediately.

FIG. 4 describes a basic measuring apparatus for electrolysers 1, consisting of at least one cell element 2 for determining the current efficiency for each cell element. The anodic product outlet is equipped with a branch-off point at each cell element, from which product gas of each cell element can be bled off to the gas measuring device for the purpose of measuring the oxygen in the product gas 19. Gas bleeding is always performed via valve 26 using an appropriately timed measuring logic, before the gas is discarded after completion of the measurement. The analysis of the gas of each cell element is therefore successive in that valve 26 in the anodic product outlet of a cell element is opened, gas is conveyed to the measuring instrument and measured, valve 26 is then closed again and the entire process is continued with the next cell element. The acid that may be fed to the anodic reactant stream must be defined in the same way for each cell element and is, for this purpose, fed for each cell element in a decentralised way to anodic reactant feed 21. The measurement is performed such that by using a measuring logic via appropriately timed valves 24, the acid is not fed directly, but is conveyed via a measuring instrument 20 arranged in parallel, and the flow rate is therefore determined before the acid is conveyed to the cell. Additionally, for flow measurement, valves 24 of the corresponding cell element are opened and the parallel bypass valve 25 closed, the measurement is performed, then valves 24 are closed again and bypass valve 25 is opened again. This process is performed sequentially for each cell element so that cell-specific results are obtained for the set oxygen content in the product gas and the fed acid quantity, which allow the current efficiency to be determined according to formula (3).

LIST OF REFERENCE NUMBERS AND DESIGNATIONS 1 electrolyser
2 cell element
3a, 3b method steps
4a, 4b method steps
5a, 5b method steps
6a, 6b method steps
7a, 7b method steps
8a, 8b, 8c additional steps
9 graphical representation of voltage ranges
10 voltage values
11 voltage regression line
12, 13 voltage straight lines
14 graphical representation of specific energy consumption operating ranges
15 specific energy consumption values
16 specific energy consumption regression line
17, 18 specific energy consumption straight lines
19 measuring instrument for oxygen concentration in product gas
20 measuring instrument for acid quantity
21 anodic reactant feed (brine feed)
22 anodic product outlet (anolyte)
23 acid feed to reactant
24 valves for acid quantity measuring apparatus
25 bypass valve for acid directly to the cell element
26 valve for gas measuring apparatus

FORMULA SYMBOLS

| Symbol | Meaning | Unit |
|---|---|---|
| C | constant, axis intercept | [V] |
| $c_A$ | mass concentration of acid | [kg/kg] |
| $d_A$ | density of acid | [kg/L] |
| $\Delta EV$ | specific energy consumption change | [kWh/t] |
| $\Delta j$ | current density change | [kA/m$^2$] |
| $\Delta U$ | voltage change | [V] |
| $\Delta U_i$ | voltage difference element i to mean | [V] |
| EV | specific energy consumption | [kWh/t] |
| $EV_{min}$ | minimum specific energy consumption | [kWh/t] |
| $EV_{max}$ | maximum specific energy consumption | [kWh/t] |
| $EV_{0, min}$ | axis intercept lower energy consumption limit line | [kWh/t] |
| $EV_{0, max}$ | axis intercept upper energy consumption limit line | [kWh/t] |
| F | specific Faraday constant | [t/kAh] |

| Symbol | Meaning | Unit |
| --- | --- | --- |
| I | current intensity | [kA] |
| j | current density | [kA/m$^2$] |
| k | constant, gradient | [V/kA] |
| $k_{min}$ | gradient of lower voltage limit line | [V/(kA/m$^2$)] |
| $k_{max}$ | gradient of upper voltage limit line | [V/(kA/m$^2$)] |
| $k_{EV, min}$ | gradient of lower energy consumption limit line | [(kWh/t)/(kA/m$^2$)] |
| $k_{EV, max}$ | gradient of upper energy consumption limit line | [(kWh/t)/(kA/m$^2$)] |
| K | temperature correction factor | [K/V] |
| $M_P$ | practically formed product quantity | [kg] |
| $M_T$ | theoretically possible product quantity | [kg] |
| N | number of cell elements of an electrolyser | [—] |
| P1 | parameter | [%] |
| P2 | parameter | [% kg/kAh] |
| P3 | parameter | [%] |
| $Q_A$ | acid flow stream | [L/h] |
| S | current efficiency | [%] |
| t | time | [s] |
| T | mean temperature | [° C.] |
| $T_i$ | individual element temperature | [° C.] |
| U | voltage | [V] |
| $U_i$ | single element voltage | [V] |
| $U_{min}$ | minimum voltage | [V] |
| $U_{max}$ | maximum voltage | [V] |
| $U_{0, min}$ | axis intercept, lower voltage limit line | [V] |
| $U_{0, max}$ | axis intercept, upper voltage limit line | [V] |
| $y_{O2}$ | oxygen content of gas phase | [kg/kg] |

The invention claimed is:

1. Method for operating an electrolyser including a plurality of cell elements, the method comprising:
a) determining, by a microprocessor, a specific energy consumption operating range of each of the plurality of cell elements by
determining a specific energy consumption of each of the plurality of cell elements with respect to a cell temperature $T_i$ of that cell element, wherein the electrolyser includes a corresponding anodic reactant feed pipe connected to an input of each of the cell elements and a corresponding anodic product outlet pipe connected to an output of each of the cell elements, wherein the anodic reactant feed pipe is configured to deliver an anodic reactant stream to the cell element and the anodic product outlet pipe is configured to remove a product gas from the cell element, wherein the electrolyser includes an acid feed branch pipe connected to each of the anodic reactant feed pipes via a respective bypass valve configured to direct acid to the cell element when open and prevent directing of the acid to the cell element when closed, the acid feed branch pipe including an acid flow meter connected in parallel with each of the anodic reactant feed pipes via respective first and second acid quantity measuring apparatus valves, wherein the first acid quantity measuring apparatus valve is configured to direct the acid to the acid flow meter when open and prevent directing of the acid to the acid flow meter when closed, and wherein the second acid quantity measuring apparatus valve is configured to direct the acid from the acid feed branch pipe to the cell element when open and prevent removing of the acid from the acid feed branch pipe to the cell element when closed, wherein the electrolyser includes a branch-off point connected to each of the anodic product outlet pipes via a respective bleed off valve and including a gas measuring device, wherein each of the bleed off valves is configured to bleed off the product gas of the corresponding cell element to the gas measuring device when open and prevent bleeding off of the product gas of the corresponding cell element to the gas measuring device when closed, wherein the microprocessor is electrically connected with and configured to selectively command open and closed at least one of bypass valves, first and second acid quantity measuring apparatus valves, and bleed off valves, wherein the microprocessor is configured to receive signals from first and second temperature sensors disposed within respective shared cathodic and anodic product outlets of the electrolyser, and wherein the microprocessor is configured to receive signals from a corresponding voltage sensor of each of the cell elements, wherein the cell temperature $T_i$ is determined by measuring, in a shared cathodic product outlet of the plurality of the cell elements, a mean cathodic temperature of cathodic compartments of the plurality of cell elements, measuring, in a shared anodic product outlet of the plurality of cell elements, a mean anodic temperature of anodic compartments of the plurality of cell elements, determining a mean electrolyser temperature T by calculating an average of the measured mean anodic temperature and the measured mean cathodic temperature, measuring voltages $U_i$ of each of the plurality of cell elements and determining a mean electrolyser voltage $U_M$ by calculating an average of the measured voltages $U_i$, calculating a difference $\Delta U_i$ between each of the measured voltages $U_i$ and the mean electrolyser voltage $U_M$, and determining the cell temperature $T_i$ based on a sum of both the mean electrolyser temperature T and a product of the difference $\Delta U_i$ and an empirical proportionality factor K, wherein the factor K is within a range between 10 Kelvin/V and 30 Kelvin/V, and determining current efficiency of each of the plurality of cell elements based on an electrolysis current I, a measured amount of oxygen $y_{o2}$ in the product gas output by each of the plurality of cell elements, a measured flow rate of the acid stream $Q_A$ input to each of the plurality of cell elements, density of the acid $d_A$, mass concentration $c_A$ of the acid, a first empirical parameter P1, a second empirical parameter P2, and a third empirical parameter P3, wherein the first parameter P1 is within one of a first P1 range between 98.5% and 99.5% and a second P1 range between 98.5% and 99.5%, the second parameter P2 is within one of a first P2 range between 50% kg/kAh and 100% kg/kAh and a second P2 range between 70% kg/kAh and 90% kg/kAh, and the third parameter P3 is within one of a first P3 range between 2.0% and 3.0% and a second P3 range between 2.4% and 2.6%, wherein the flow rate of the acid stream $Q_A$ directed to each of the plurality of cell elements is measured by commanding closed the bypass valve corresponding to the cell element and commanding open the first acid quantity measuring apparatus valve corresponding to a same one of the cell elements to direct the acid stream to the acid flow meter over a predefined period, commanding closed the first acid quantity measuring apparatus valve and measuring the flow rate of the acid stream $Q_A$ to the cell element using the acid flow meter prior to commanding open the second acid quantity measuring apparatus valve corresponding to the cell element to direct the acid stream to the cell element, and wherein the measured amount of the oxygen $y_{o2}$ output by a same one of the cell elements is measured by commanding open the bleed off valve corresponding to the cell element to direct the product gas of the cell element to the gas measuring device over a predefined period, commanding closed the bleed off valve and measuring the amount of the oxygen $y_{o2}$ in the product gas using the gas measuring device;

b) measuring voltage of each of the plurality of cell elements over the predefined period;

c) calculating specific energy consumption of each of the plurality of cell elements over the predefined period based on the measured voltage and the determined current efficiency of that cell element;

d) normalising the calculated specific energy consumption of each of the cell elements using regression;

e) comparing the normalised specific energy consumption of each of the cell elements with the specific energy consumption operating range of that cell element; and f) displaying an alarm notification and switching off the electrolyser to interrupt operation of the same in response to detecting that the normalised specific energy consumption of at least one cell element is at least one of (i) less than a minimum threshold of the operating range of that cell element or (ii) greater than a maximum threshold of the operating range of that cell element.

2. The method according to claim 1 further comprising determining a first rate of change of the normalised specific energy consumptions, comparing the determined rate of change to a second rate of change of the operating range, and sending the alarm notification in response to detecting that the first rate of change is at least one of less than or greater than a corresponding one of rates of change of the minimum threshold and the maximum threshold, respectively.

3. The method according to claim 1, wherein the electrolyser is a chlor-alkali electrolyser.

4. The method according to claim 1 further comprising selecting operating parameters of one of the plurality of cell elements to be reference values for corresponding operating parameters of each of the other cell elements.

5. The method according to claim 1 further comprising selecting operating parameters of a theoretical cell element to define reference values for the corresponding operating parameters of each of the plurality of cell elements, wherein the theoretical cell and the corresponding cell element define a same cell configuration, same cell components, same membrane type, same electrode coating material, same process conditions, and same operating time.

6. A tester for a chlor-alkali electrolyser including a plurality of cell elements, the tester comprising:

a corresponding anodic reactant feed pipe connected to an input of each of the cell elements and a corresponding anodic product outlet pipe connected to an output of each of the cell elements, wherein the anodic reactant feed pipe is configured to deliver an anodic reactant stream to the cell element and the anodic product outlet pipe is configured to remove a product gas from the cell element;

an acid feed branch pipe connected to each of the anodic reactant feed pipes via a respective bypass valve configured to direct acid to the cell element when open and prevent directing of the acid to the cell element when closed, the acid feed branch pipe including an acid flow meter connected in parallel with each of the anodic reactant feed pipes via respective first and second acid quantity measuring apparatus valves, wherein the first acid quantity measuring apparatus valve is configured to direct the acid to the acid flow meter when open and prevent directing of the acid to the acid flow meter when closed, and wherein the second acid quantity measuring apparatus valve is configured to direct the acid from the acid feed branch pipe to the cell element when open and prevent removing of the acid from the acid feed branch pipe to the cell element when closed;

a branch-off point connected to each of the anodic product outlet pipes via a respective bleed off valve and including a gas measuring device, wherein each of the bleed off valves is configured to bleed off the product gas of the corresponding cell element to the gas measuring device when open and prevent bleeding off of the product gas of the corresponding cell element to the gas measuring device when closed; and a microprocessor electrically connected with and configured to selectively command open and closed at least one of the bypass valves, the first and second acid quantity measuring apparatus valves, and the bleed off valves, wherein the microprocessor is configured to receive signals from first and second temperature sensors disposed within respective shared cathodic and anodic product outlets of the electrolyser, wherein the microprocessor is configured to receive signals from a corresponding voltage sensor of each of the cell elements, and wherein the microprocessor is configured to:

a) determine a safe and economical specific energy consumption operating range of each of the cell elements by determining a specific energy consumption of each of the cell elements with respect to a cell temperature $T_i$ of that cell element, the cell temperature $T_i$ being determined based on signals, from the first temperature sensor, indicative of a mean cathodic temperature of the cathodic compartments, signals, from the second temperature sensor, indicative of a mean anodic temperature of the anodic compartments, determining a mean electrolyser temperature T by calculating an average of the measured mean anodic temperature and the measured mean cathodic temperature, measuring voltages $U_i$ of each of the plurality of cell elements and determining a mean electrolyser voltage $U_M$ by calculating an average of the measured voltages $U_i$, calculating a difference $\Delta U_i$ between each of the measured voltages $U_i$ and the mean electrolyser voltage $U_M$, determining the cell temperature $T_i$ defined based on a sum of both the mean electrolyser temperature T and a product of the difference $\Delta U_i$ and an empirical proportionality factor K, wherein the factor K is within a range between 10 Kelvin/V and 30 Kelvin/V, and determining current efficiency of each of the plurality of cell elements based on an electrolysis current I, a measured amount of oxygen $y_{o2}$ in the product gas output by each of the plurality of cell elements, a measured flow rate of the acid stream $Q_A$ input to each of the plurality of cell elements, density of the acid $d_A$, mass concentration $c_A$ of the acid, a first empirical parameter P1, a second empirical parameter P2, and a third empirical parameter P3, wherein the first parameter P1 is within one of a first P1 range between 98.5% and 99.5% and a second P1 range between 98.5% and 99.5%, the second parameter P2 is within one of a first P2 range between 50% kg/kAh and 100% kg/kAh and a second P2 range between 70% kg/kAh and 90% kg/kAh, and the third parameter P3 is within one of a first P3 range between 2.0% and 3.0% and a second P3 range between 2.4% and 2.6%, wherein the flow rate of the acid stream $Q_A$ directed to each of the plurality of cell elements is measured by commanding closed the bypass valve corresponding to the cell element and commanding open the first acid quantity measuring apparatus valve corresponding to a same one of the cell elements to direct the acid stream to the acid flow meter over a predefined period, commanding closed the first acid quantity measuring apparatus valve and measuring the flow rate of the acid stream $Q_A$ to the cell element using the acid flow meter prior to commanding open the second acid quantity measuring apparatus valve corresponding to the cell element to direct the acid stream to the cell element, and wherein the measured amount of the oxygen $y_{o2}$ output by a same one of the cell elements is measured by commanding open the bleed off valve corresponding to the cell element to direct the product gas of the cell element to the gas measuring device over a predefined period, commanding closed the bleed off valve and measuring the amount of the oxygen $y_{o2}$ in the product gas using the gas measuring device;

b) measure voltage of each of the plurality of cell elements over the predefined period;

c) calculate specific energy consumption of each of the plurality of cell elements over the predefined period based on the measured voltage and the determined current efficiency of that cell element;

d) normalise the calculated specific energy consumption of each of the cell elements using regression;

e) compare the normalised specific energy consumption of each of the cell elements with the specific energy consumption operating range of that cell element; and f) display an alarm notification and switch off the electrolyser to interrupt operation of the same in response to detecting that the normalised specific energy consumption of at least one cell element is at least one of (i) less than a minimum threshold of the operating range of that cell element or (ii) greater than a maximum threshold of the operating range of that cell element.

7. The tester according to claim 6, wherein the microprocessor is further configured to determine a first rate of change of the normalised specific energy consumptions, compare the determined rate of change to a second rate of change of the operating range, and send the alarm notification in response to detecting that the first rate of change is at least one of less than or greater than a corresponding one of rates of change of the minimum threshold and the maximum threshold, respectively.

* * * * *